(12) United States Patent
Hiew et al.

(10) Patent No.: US 7,804,163 B2
(45) Date of Patent: *Sep. 28, 2010

(54) SEAMLESS SECURED DIGITAL CARD MANUFACTURING METHODS WITH MALE GUIDE AND FEMALE SWITCH

(75) Inventors: Siew Sin Hiew, San Jose, CA (US); Nan Nan, San Jose, CA (US); Abraham Chih-Kang Ma, Fremont, CA (US); Paul Hsueh, Concord, CA (US)

(73) Assignee: SuperTalent Electronics, Inc., San Jose, CA (US)

( * ) Notice: Subject to any disclaimer, the term of this patent is extended or adjusted under 35 U.S.C. 154(b) by 650 days.

This patent is subject to a terminal disclaimer.

(21) Appl. No.: 11/744,119

(22) Filed: May 3, 2007

(65) Prior Publication Data

US 2007/0262155 A1 Nov. 15, 2007

Related U.S. Application Data

(63) Continuation-in-part of application No. 10/913,868, filed on Aug. 6, 2004, now Pat. No. 7,264,992.

(51) Int. Cl.
*H01L 23/02* (2006.01)
*H05K 1/14* (2006.01)
*G06K 19/06* (2006.01)

(52) U.S. Cl. ............... 257/679; 257/678; 361/737; 235/492

(58) Field of Classification Search .......... 257/678, 257/679; 361/737; 235/492
See application file for complete search history.

(56) References Cited

U.S. PATENT DOCUMENTS

| | | | |
|---|---|---|---|
| 6,381,143 B1 * | 4/2002 | Nakamura | 361/737 |
| 6,580,615 B1 * | 6/2003 | Nakanishi et al. | 361/737 |
| 6,590,778 B1 * | 7/2003 | Hojo et al. | 361/737 |
| 6,632,997 B2 * | 10/2003 | Hoffman et al. | 174/527 |
| 6,910,635 B1 * | 6/2005 | Miks et al. | 235/487 |
| 7,120,029 B2 * | 10/2006 | Nishizawa et al. | 361/737 |
| 7,378,301 B2 * | 5/2008 | Koh et al. | 438/126 |
| 7,407,393 B2 | 8/2008 | Ni et al. | |
| 7,420,803 B2 | 9/2008 | Hsueh et al. | |

* cited by examiner

*Primary Examiner*—Luan C Thai
(74) *Attorney, Agent, or Firm*—Maryam Imam; IPxLaw Group LLP (57) ABSTRACT

A secured digital (SD) card including a bottom plastic piece having a plurality of lateral sides, said bottom plastic piece further having a cavity interposed along said plurality of lateral sides, in accordance with an embodiment of the present invention. The SD card further having a top cover and a printed circuit board (PCB) assembly positioned in said cavity, said top cover for covering said PCB assembly inside said cavity, one of said plurality of lateral sides of said bottom plastic piece having a notch, said SD card further having a male guide insertably positioned inside said notch, said SD card further having a female switch clamped onto said male guide to form a write-protect switch.

14 Claims, 8 Drawing Sheets

SEAMLESS SECURED DIGITAL CARD MANUFACTURING METHODS WITH MALE GUIDE AND FEMALE SWITCH

CROSS REFERENCE TO RELATED APPLICATIONS

This application relates to U.S. patent application Ser. No. 11/744,125, filed on May 3, 2007, entitled "TWO STEP MOLDING PROCESS SECURED DIGITAL CARD MANUFACTURING METHOD AND APPARATUS" and is a continuation-in-part of U.S. patent application Ser. No. 10/913,868 filed on Aug. 6, 2004, and entitled "REMOVABLE FLASH INTEGRATED MEMORY MODULE CARD AND METHOD OF MANUFACTURE", which are incorporated herein by reference as though set forth in full.

BACKGROUND OF THE INVENTION

1. Field of the Invention

The present invention relates generally to the field of chip on board (COB) secured digital (SD) cards and particularly to a method and apparatus for manufacturing secured digital cards with male guide and female switch to provide write-protect and read/write functionalities.

2. Description of the Prior Art

As computers have gained enormous popularity in recent decades, so has the need for better and more efficient ways of storing memory. Notable among memory devices are the portable ones that may be carried around by the user to access computers at different locations. This is particularly common in the case of personal computers (PC) where the need often arises to transfer data from one PC to another. Examples of portable memory devices include nonvolatile memory devices such as a secured digital (SD) card that is removably connectible to a computer.

Secured digital cards are available in various shapes and forms. The SD card is coupled to a host device such as a PC for storage and retrieval of data. To protect the data stored in the memory of the card in some cases a write-protect switch is available which may be activated to allow writing of information onto the memory.

However, the conventional SD cards with a write-protect switch are generally expensive to manufacture and the packaging thereof may not have the desired reliability. For example, the card may not be water and moisture resistant enough to be used in various environments.

Since the SD cards have gained ever-increasing popularity among the consumers, it is desirable to manufacture an SD card with high reliability and improved resistance against water and moisture. In addition, the SD card should have a low cost of manufacturing while at the same time possess enough versatility and esthetic quality to appeal to a wide range of potential users.

SUMMARY OF THE INVENTION

Briefly, an embodiment of the present invention includes a secured digital (SD) card having a bottom plastic piece having a plurality of lateral sides, said bottom plastic piece further having a cavity interposed along said plurality of lateral sides. The SD card further having a top cover and a printed circuit board (PCB) assembly positioned in said cavity, said top cover for covering said PCB assembly inside said cavity, one of said plurality of lateral sides of said bottom plastic piece having a notch, said SD card further having a male guide insertably positioned into said notch, said SD card further having a female switch clamped onto said male guide to form a write-protect switch.

The foregoing and other objects, features and advantages of the present invention will be apparent from the following detailed description of the preferred embodiments which make reference to several figures of the drawing.

DETAILED DESCRIPTION OF THE PREFERRED EMBODIMENTS

Figure 1:
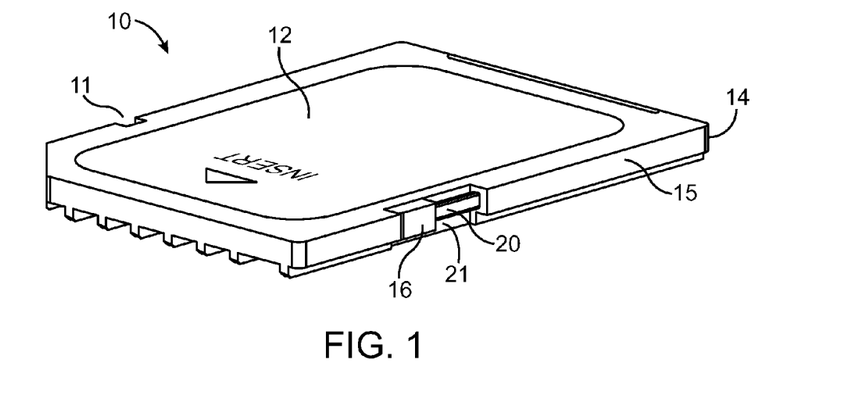
FIG. 1 shows an overall view of a secured digital (SD) card 10, in accordance with an embodiment of the present invention.

This application incorporates by reference the contents in U.S. Pat. No. 7,174,628 B1, issued on Feb. 13, 2007, and entitled "Memory Card Production Using Prefabricated Cover And Molded Casing Portion", as though set forth in full. Referring now to FIG. 1, an overall view of a secured digital (SD) card 10 is shown to include a bottom plastic piece 14, a label 12, a male guide 20 and a female switch 16, in accordance with an embodiment of the present invention. The SD card is used to store and retrieve information. Once coupled to a host device, information is transferred therebetween to be either stored in or retrieved from the SD card 10. The label 12 is positioned on top of the bottom plastic piece 14. As shown in the embodiment of FIG. 1, the bottom plastic piece 14 has a plurality of lateral sides one of which is side 15. The outer wall of lateral side 15 includes a notch 21 wherein the male guide 20 is inserted. The female switch 16 is clamped on the male guide 20 to form a write-protect switch for the SD card 10.

The purpose of the male guide 20 and female switch 16 is to provide write-protect capability to the SD card 10 which protects the information stored therein from being overwritten. Specifically, the female switch 16 can slide over the male guide 20 to assume two positions whereby the female switch 16 comes in contact with each of the two inner sides of the notch 21. The first of the two positions is the write-protect position where information cannot be written onto the memory unit of the SD card 10. The second position is the read/write position where information may be written into the memory unit of the card 10. The position of the female switch 16 determines either of the two positions. The position of the female switch 16 in FIG. 1 corresponds to the second position.

One of the advantages of the SD card 10 is in providing resistance to moisture and water while at the same time having a considerably low cost of manufacturing.

Printed on the label 12 is the company's custom designed logo and information which is attached to the top surface of the SD card 10. The label 12 has an adhesive layer on the backside for attachment to the top surface of the SD card 10. In addition, the label 12 serves the purpose of covering the interfaces on the top surface of the SD card 10 to enhance esthetic value thereof, as described in more detail hereinbelow. Also shown in FIG. 1 is slot 11 for securing the SD card 10 to a host device to prevent the SD card 10 from slipping out of the host device due to gravity, vibration or other causes.

Figure 2:
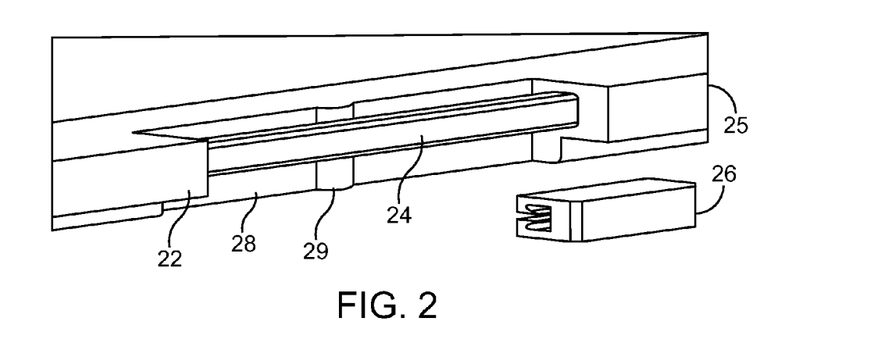
FIG. 2 shows a close up view of the male guide and female switch components, in accordance with an embodiment of the present invention.

Referring now to FIG. 2, a close up view of the male guide and female switch components are shown to include a bottom plastic piece 25, a male guide 24, and a female switch 26, in accordance with an embodiment of the present invention. The bottom plastic piece has a lateral side 22 wherein a notch 28 is positioned. The male guide 24 is inserted in the notch 28. The female switch 26 may be clamped onto the male guide 24 to form a write-protect switch. Column 29 positioned approximately in the middle of the notch 28 prevents the female switch 26 from sliding from the first write-protect position to the second read/write position.

Figure 3:
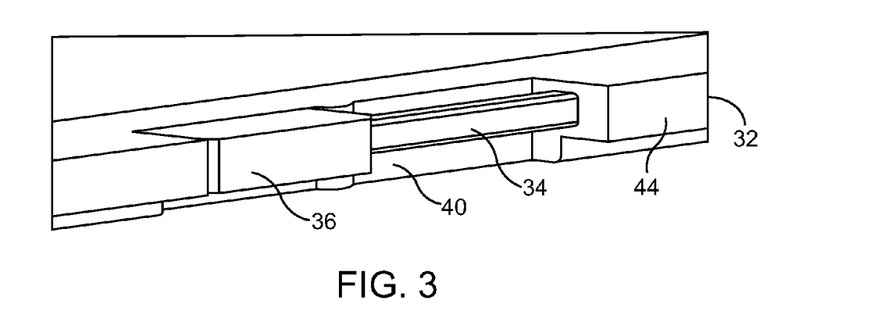
FIG. 3 shows a close up view of the male guide and female switch mechanism, in accordance with an embodiment of the present invention.

Referring now to FIG. 3, a close up view of the male guide and female switch mechanism is shown to include a bottom plastic piece 32, a lateral side 44 of the bottom plastic piece 32, a notch 40, a male guide 34 and a female switch 36, in accordance with an embodiment of the present invention. The female switch 36 is clamped onto the male guide 34 to form the write-protect switch for the SD card 10. The female switch 36 is pushed to move from the write-protect position to the read/write position and vice versa.

Figure 4:
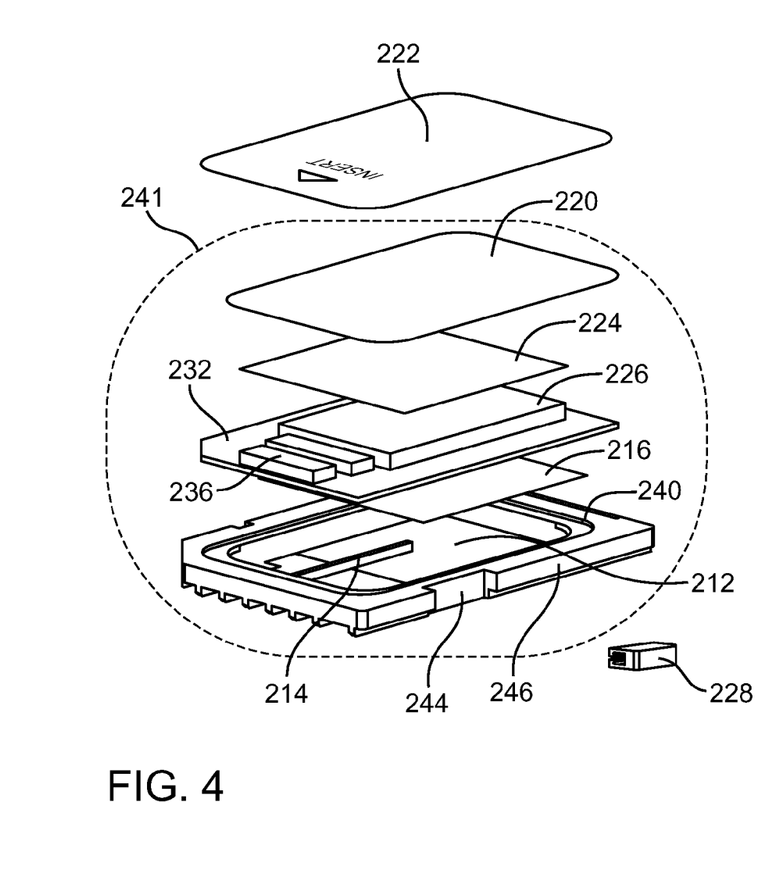
FIG. 4 shows an SD card 210, in accordance with an embodiment of the present invention.

Referring now to FIG. 4, an SD card 210 is shown, in accordance with an embodiment of the present invention. Also shown in FIG. 1 are the internal components of the SD card 210 which include a bottom plastic piece 240, male guide 214, thin film of thermal glue 216, printed circuit board (PCB) assembly 232, second thin film of thermal glue 224, top cover 220 and a label 222, in accordance with an embodiment of the present invention.

The PCB assembly 232 has a substrate unto which a memory unit 226, controller 236 and other components are mounted using surface mount technology (SMT). In the embodiment of the present invention shown in FIG. 4, memory unit 226 is a flash memory unit. The substrate of the PCB assembly 232 has gold fingers onto which flash memory unit 226, controller 236 and other components are mounted with solder paste to make the PCB assembly 232 into surface mount technology (SMT) memory module.

Bottom plastic piece 240 is molded to form a cavity 212 in a molding manufacturing process. Cavity 212 has an upper lid which gives a shoe shaped appearance to bottom plastic piece 240. Bottom plastic piece is manufactured to Super Talent Technologies (STT) unique design and conforms to the standard memory card dimension and specifications. In other embodiments of the present invention cavity 212 has other shapes such as rectangular parallelopiped, cube, etc.

Bottom plastic piece 240 has a plurality of lateral sides, one of which is the lateral side 246 which includes a notch 244. Located adjacent to the inner wall of the lateral side 246 is a guide rail wherein the male guide 214 is dropped so that the middle part thereof is exposed through the notch 244. Male guide 214 may be made from metal, ceramic or any other material which can withstand high temperatures of the molding process and other mechanical forces in the manufacturing process.

To assemble the SD card 210, the thin film of thermal glue 216 which is a two-sided thermal glue is attached to the bottom surface of cavity 212. The PCB assembly 232 is insertably positioned in cavity 232 such that the end in closer proximity to controller 236 is first inserted under the upper lid of the bottom plastic piece 240 and then the other end is pressed into cavity 212. The PCB assembly 232 is positioned on top of the thin film of thermal glue 216 and attached thereon. The other thin film of thermal glue 224 is attached to the top surface of the PCB assembly 232. The top cover 220 made of metal or plastic is attached to the top surface of the thin film of thermal glue 224 to form an assembly 241.

Assembly 241 is placed inside a furnace and heated to thermally bond the bottom plastic piece 240, PCB assembly 232 and top cover 220 to form a single unit. The label 222, which has an adhesive underside is attached to the top surface of top cover 220. Printed on label 222 is the Company's custom designed logo and other information. In addition, label 222 covers the interface between the top cover 220 and top surface of the lateral sides of bottom plastic piece 240 to add a seamless outlook to the SD card 210 which is esthetically more appealing. Female switch 228 is then clamped on the male guide 214. Female switch 228 is made of metal or plastic.

In other embodiments of the present invention a chip on board (COB) printed circuit board (PCB) assembly instead of the standard PCB assembly 232 is positioned inside the bottom plastic piece 240.

Among advantages of the SD card 210 are enhanced resistance to water and moisture, partly due to presence of label 222, and considerably low cost of manufacturing.

Figure 5:
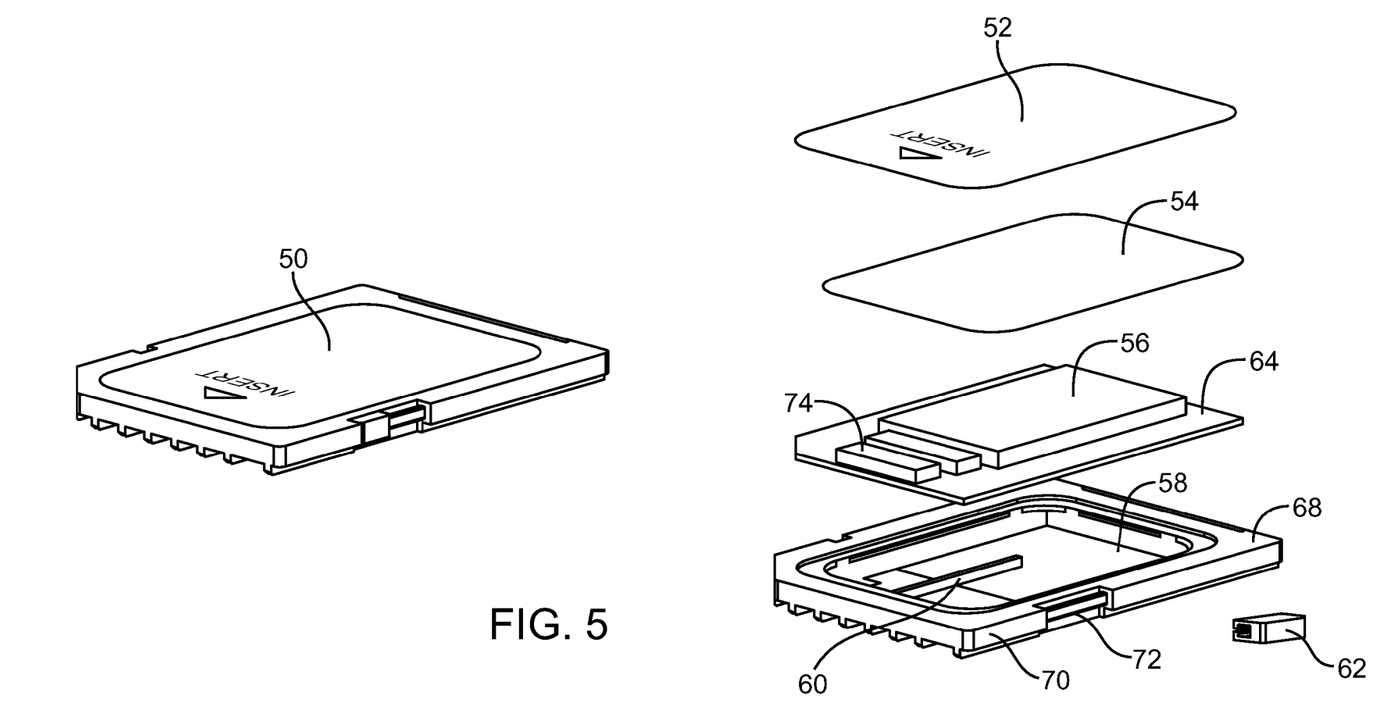
FIG. 5 shows an SD card 50, in accordance with an embodiment of the present invention.

Referring now to FIG. 5, an alternative embodiment of the present invention is shown to include an SD card 50. The SD card 50 is shown to include a bottom plastic piece 58, male guide 60, PCB assembly 64, female switch 62, top cover 54 and a label 52, in accordance with an embodiment of the present invention.

Bottom plastic piece 68 is molded to form a cavity 58 in a molding manufacturing process. Cavity 58 has an upper lid which gives a shoe shaped appearance to bottom plastic piece 58. Lateral side 70 of the bottom plastic piece 68 includes a notch 72. Located adjacent to the inner wall of the lateral side 70 is a guide rail wherein male guide 60 is dropped so that the middle part thereof is exposed through the notch 72.

Printed circuit board (PCB) assembly 64 which includes electronic components such as flash memory unit 56 and controller 74 is insertably positioned inside cavity 58 such that the end in closer proximity to controller 74 is first inserted under the upper lid and then the other end is pressed inside the cavity 58.

To assemble the SD card 50 top cover 54, being made of plastic, is positioned on top of the PCB assembly 64 and snapped onto the top of bottom plastic piece 68. The inner edges of the lateral sides have grooves to lock the top cover 54 in place, as described in more detail hereinbelow. Label 52 with an adhesive underside is attached to the top surface of top cover 54 with Company's logo and other information printed thereon. Label 52 also covers the interface between top cover 54 and top surface of the lateral sides of bottom plastic piece 68 thereby rendering the SD card 50 seamless with enhanced esthetic value. In addition, water and moisture resistance of the SD card 50 is enhanced while the cost of manufacturing is lowered partly due to the use of limited number of components therein.

Figure 6A:
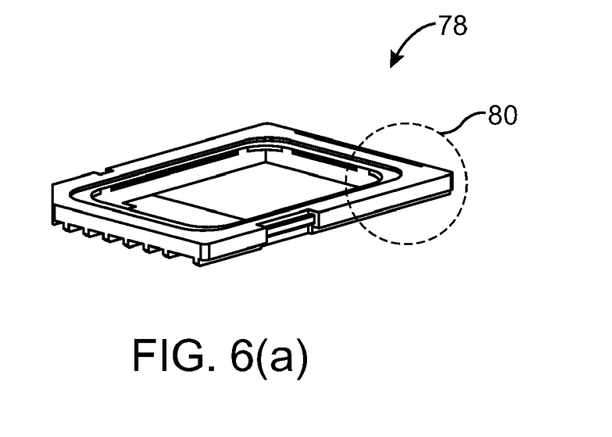
FIG. 6(a) shows a bottom plastic piece 78 to include a corner 80, in accordance with an embodiment of the present invention.
Figure 6B:
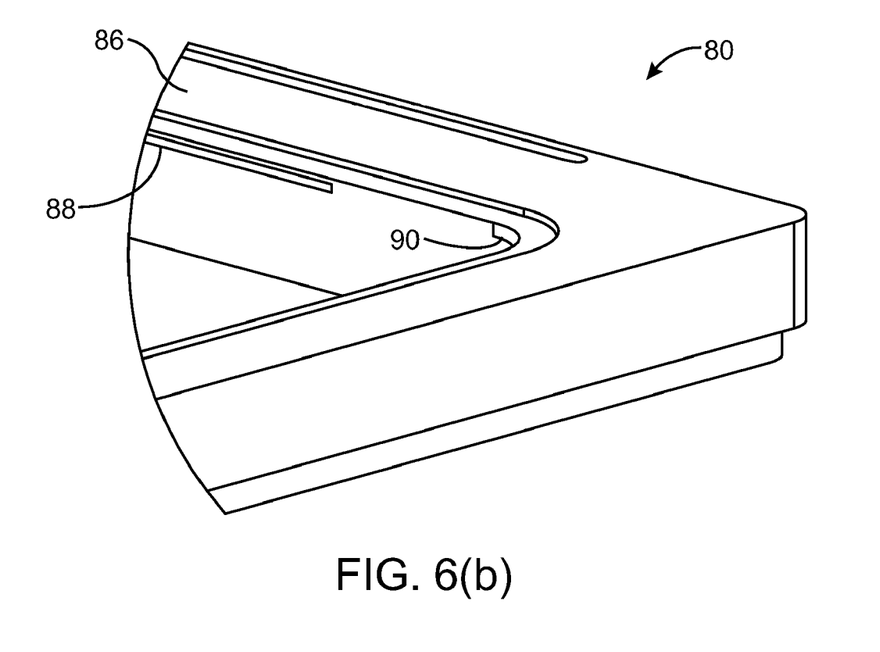
FIG. 6(b) shows an enlarged view of the corner 80 including a lateral side 86, in accordance with an embodiment of the present invention.

Referring now to FIG. 6(a), a bottom plastic piece 78 is shown to include a corner 80, in accordance with an embodiment of the present invention. FIG. 6(b) shows an enlarged view of the corner 80 including a lateral side 86, in accordance with an embodiment of the present invention. The inner edge of lateral side 86 includes a groove 88 into which the edge of top cover 54 is snapped to be secured on top of the PCB assembly 64. The edge of top cover 54 has a protrusion strip that snaps into the groove 88 to lock in place the top cover 54.

In other embodiments of the present invention top cover 54 and label 52 are combined to form a single component by printing Company's logo and other information directly on top of the top cover 54 to further reduce the number of components needed to manufacture the SD card 50. Finally, female switch 62 is clamped onto male guide 60 to complete assembly of the SD card 50.

Figure 7:
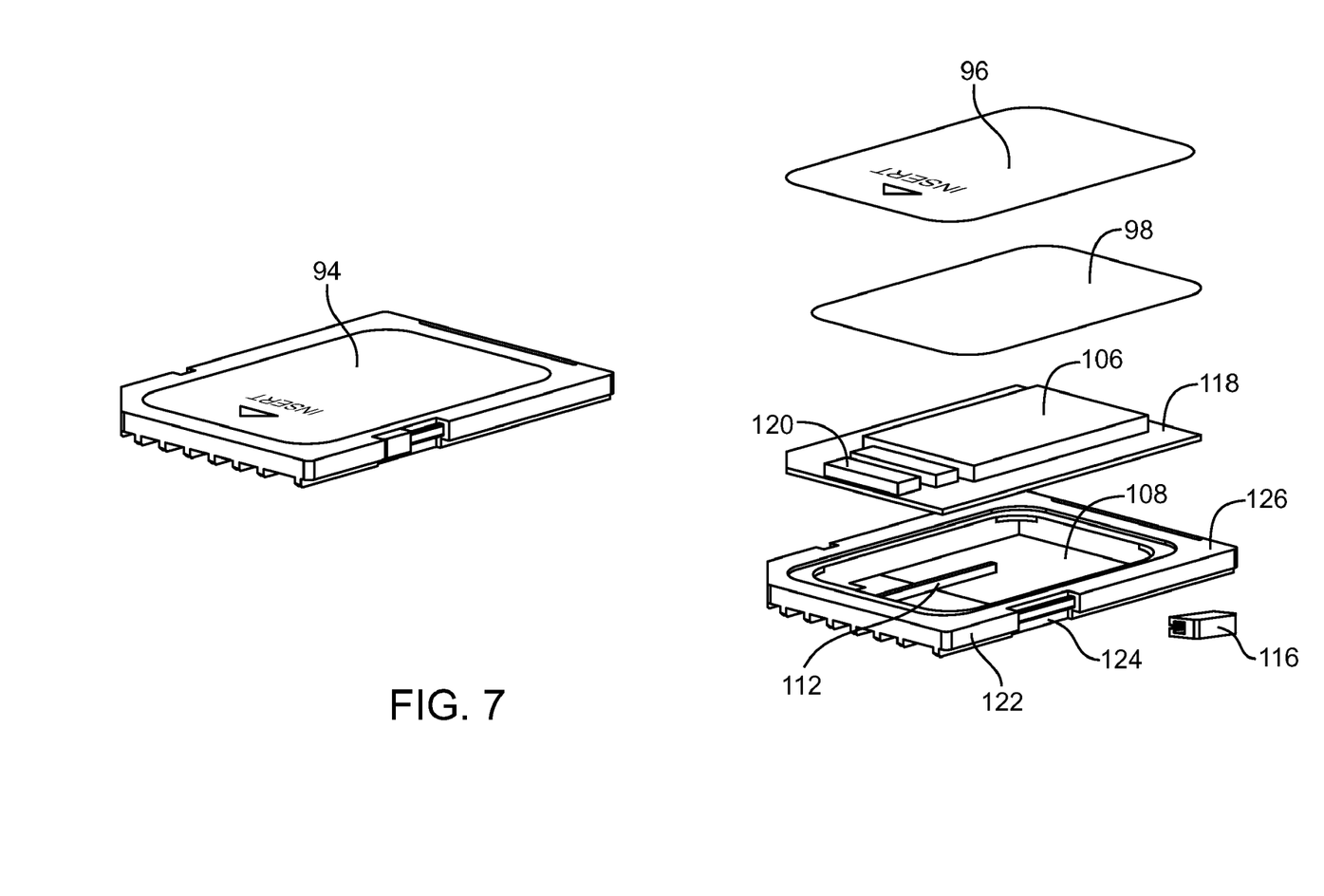
FIG. 7 shows an SD card 94, in accordance with an embodiment of the present invention.

Referring now to FIG. 7, an alternative embodiment of the present invention is shown to include an SD card 94. The SD card 94 includes a bottom plastic piece 126, PCB assembly 118, top cover 98, label 96, male guide 112 and a female switch 116, in accordance with an embodiment of the present invention.

Bottom plastic piece 126 is molded to form a cavity 108 in a molding manufacturing process. Cavity 108 has an upper lid which gives a shoe shaped appearance to bottom plastic piece 126. Lateral side 122 of bottom plastic piece 126 includes a notch 124. Located adjacent to the inner wall of the lateral side 122 is a guide rail wherein male guide 112 is dropped so that the middle part thereof is exposed through the notch 124.

The PCB assembly 118 which includes electronic components such as flash memory unit 106 and controller 120 is insertably positioned inside cavity 108 such that the end in closer proximity to controller 120 is first inserted under the upper lid and then the other end is pressed inside cavity 108.

To assemble the SD card 94, top cover 98 made from plastic is positioned on top of the PCB assembly 118 over the opening of cavity 108 and pressed therein. The whole assembly is placed in an ultrasonic machine which vibrates for one or more seconds. Thus, interfaces between top cover 98 and top surface of the lateral sides fuse by cross linking under high frequency vibration. Label 96 with an adhesive underside is attached to the top surface of top cover 98 with Company's logo and other information printed thereon. Label 96 also covers the interface between top cover 106 and top surface of the lateral sides of bottom plastic piece 126 to render the SD card 94 seamless with enhanced esthetic value. In addition, water and moisture resistance of the SD card 94 is enhanced while the cost of manufacturing is reduced. To complete assembly of the SD card 94, female switch 116 is clamped onto the male guide 112.

In other embodiments of the present invention top cover 98 and label 96 are combined in to one component by printing Company's logo and other information directly on the top surface of top cover 98 further reducing the number of components needed to manufacture the SD card 94.

Figure 8A:
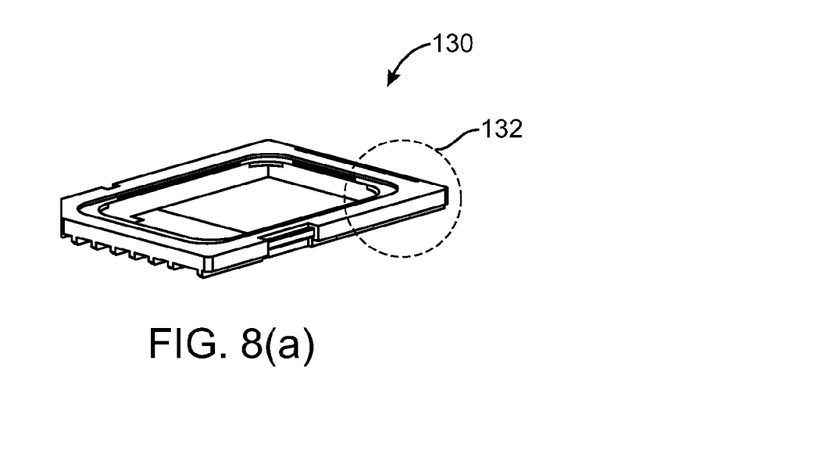
FIG. 8(a) shows a bottom plastic piece 130 to include a corner 132, in accordance with an embodiment of the present invention.
Figure 8B:
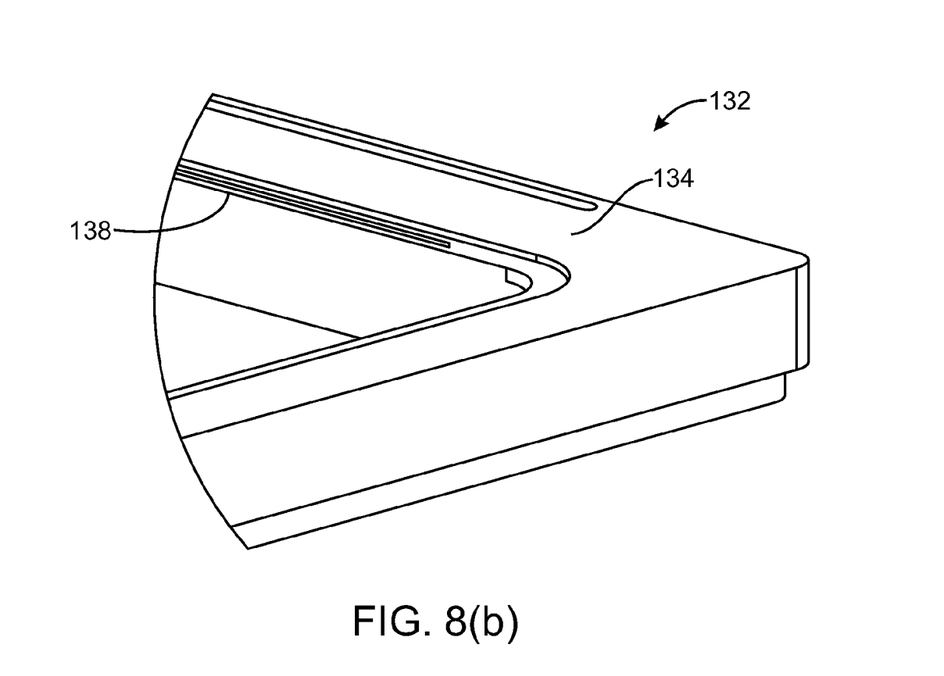
FIG. 8(b) shows an enlarged view of the corner 132 including a lateral side 134, in accordance with an embodiment of the present invention.

Referring now to FIG. 8(a), a bottom plastic piece 130 is shown to include a corner 132, in accordance with an embodiment of the present invention. FIG. 8(b) shows an enlarged view of the corner 132 including a lateral side 134, in accordance with an embodiment of the present invention. The inner edge of the lateral side 134 is fused with the edge of top cover 98 in an ultrasonic press welding process, as described hereinabove. Positioned on the top surface of the lateral side 134 is a strip 138 with triangular cross section having one vertex pointing upward to collect the vibrating energy in a sharp point, i.e. the vertex, so that the fusing process takes less energy to complete.

Figure 9:
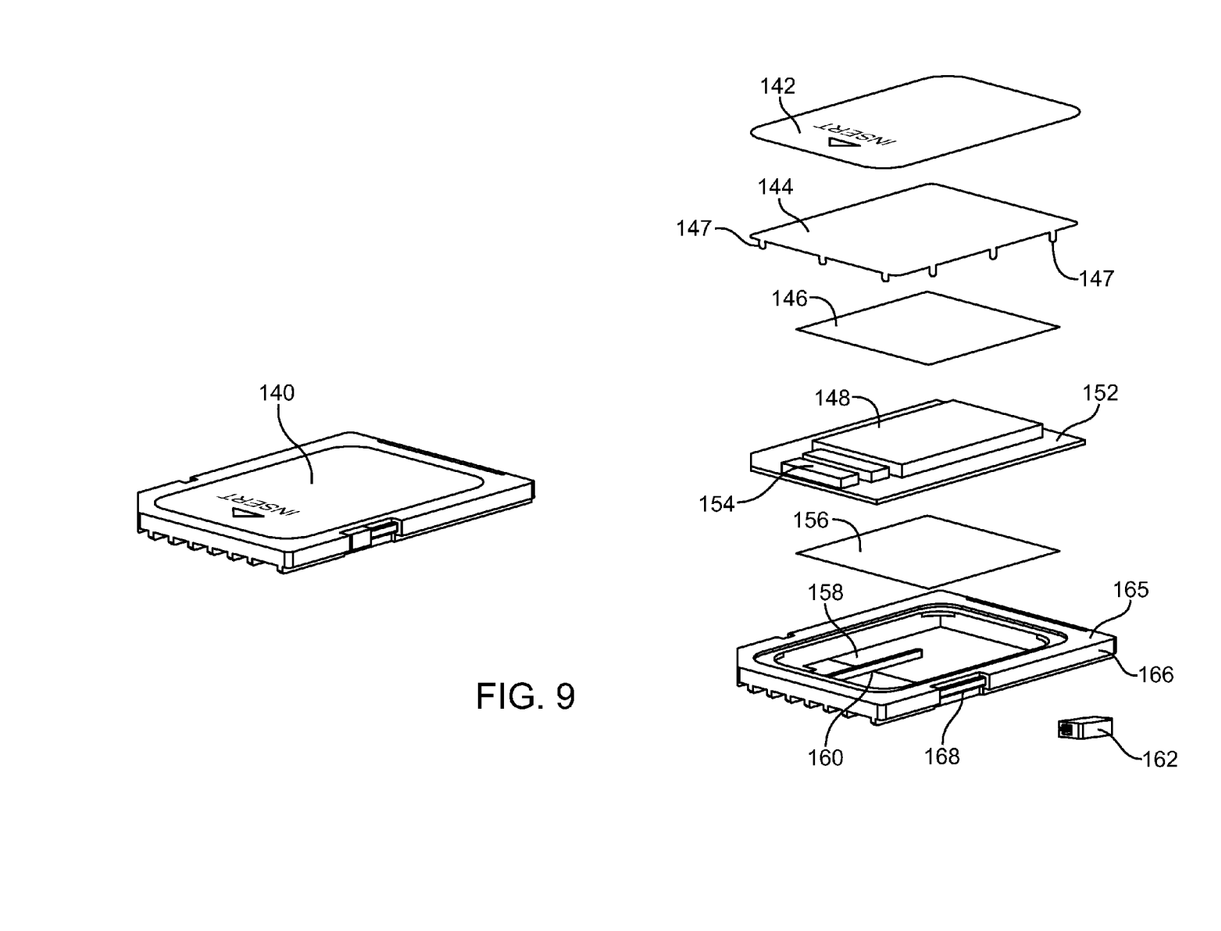
FIG. 9 shows an SD card 140, in accordance with an embodiment of the present invention.

Referring now to FIG. 9, an alternative embodiment of the present invention is shown to include an SD card 140 having a bottom plastic piece 165, male guide 160, PCB assembly 152, top cover 144, label 142, female switch 162 and two 2-sided adhesive layers 146 and 156.

Bottom plastic piece 165 is molded to form cavity 158 in a molding manufacturing process. Cavity 158 has an upper lid which gives a shoe shaped appearance to bottom plastic piece 165. Lateral side 166 of bottom plastic piece 165 includes a notch 168. Located adjacent to the inner wall of lateral side 166 is a guide rail wherein the male guide 160 is dropped so that the middle part thereof is exposed through the notch 168.

Adhesive layer 156 is attached to the bottom surface of cavity 158. The PCB assembly 152 which includes electronic components such as flash memory unit 148 and controller 154 is insertably positioned inside cavity 158 and attached to the top surface of adhesive layer 156. The end of the PCB assembly 152 in closer proximity to controller 154 is first inserted under the upper lid of the bottom plastic piece 165 and then the other end is pressed inside cavity 158.

Adhesive layer 146 is attached to the top of PCB assembly 152. Top cover 144, being made of metal, includes a plurality of locking fingers 147 along the edges and bottom plastic piece 165 includes a plurality of slots along the top surface of the lateral sides. To assemble the SD card 140 top cover 144 is attached to the top surface of adhesive layer 146 and positioned on top of the PCB assembly 152 such that locking fingers 147 are aligned with the slots of the lateral sides. Top cover 144 is then pressed down to insert locking fingers 147 inside the slots of the lateral sides to form a single unit.

Label 142 with an adhesive underside is attached to the top surface of top cover 144 with Company's logo and other information printed thereon. Label 142 also covers the interface between top cover 144 and top surface of the lateral sides to render the SD card 140 seamless enhancing the esthetic value thereof. In addition, water and moisture resistance of the SD card 140 is enhanced while the cost of manufacturing is reduced. To complete assembly of the SD card 140, female switch 162 is clamped onto male guide 160. In other embodiments of the present invention top cover 144 and label 142 are combined into a single component by printing Company's logo and other information directly on top cover 144.

Figure 10:
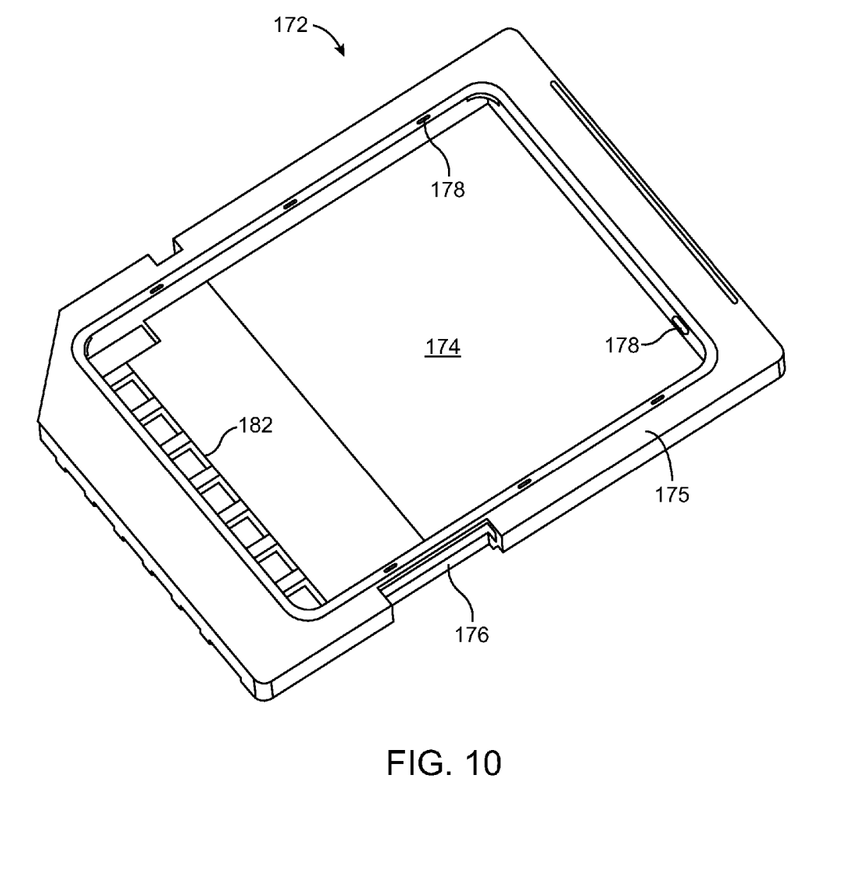
FIG. 10 shows a bottom plastic piece 172, in accordance with an embodiment of the present invention.

Referring now to FIG. 10, a bottom plastic piece 172 is shown to include a cavity 174 and an interface connector 182, in accordance with an embodiment of the present invention. Interface connector 182 couples the SD card 140 to a host device such as a personal computer (PC) for transfer of information such as data and images therebetween.

Inserted into the slots 178 are locking fingers 147 to secure the PCB assembly 152 inside cavity 174. In other embodiments of the present invention holes are used instead of slots to accommodate locking fingers 147.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A secured digital (SD) card comprising:
   a top cover;
   a bottom plastic piece having a plurality of lateral sides, one of the plurality of lateral sides having an inner edge including a groove into which the edge of the top cover is snapped, said bottom plastic piece further having a cavity interposed along said plurality of lateral sides; and
   a printed circuit board (PCB) assembly positioned in said cavity, said top cover for covering said PCB assembly inside said cavity, one of said plurality of lateral sides of said bottom plastic piece having a notch, said SD card further having a male guide insertably positioned into said notch, said SD card further having a female switch clamped onto said male guide to form a write-protect switch.

2. A secured digital (SD) card as recited in claim 1 further including a plurality of thin films of thermal glue, one of said plurality of thin films of thermal glue positioned between said top cover and said printed circuit board (PCB) assembly, one of said plurality of thin films of thermal glue positioned between said PCB assembly and the bottom surface of said cavity to form an assembly, said assembly being heated in a furnace to thermally bond said bottom plastic piece with said PCB assembly and said top cover.

3. A secured digital (SD) card as recited in claim 1 wherein said top cover being snapped onto the top of said bottom plastic piece to cover said printed circuit board (PCB) assembly inside said cavity, said top cover for securing said PCB assembly inside said cavity.

4. A secured digital (SD) card as recited in claim 3 wherein the inner edges of said plurality of lateral sides having grooves for locking said top cover inside the inner edges of said plurality of lateral sides.

5. A secured digital (SD) card as recited in claim 4 wherein Company's logo printed on the top surface of said top cover to reduce the number of components needed to manufacture said SD card.

6. A secured digital (SD) card as recited in claim 1 wherein the edge of said top cover and the inner edges of said plurality of lateral sides are fused under high frequency vibration in an ultrasonic press welding process to cover said printed circuit board (PCB) assembly inside said cavity.

7. A secured digital (SD) card as recited in claim 1 wherein the edges of said top cover including a plurality of locking fingers, said plurality of lateral sides including a plurality of slots along the top surface, said plurality of locking fingers insertably positioned inside said plurality of slots to cover said printed circuit board (PCB) assembly by said top cover.

8. A molded secured digital (SD) card as recited in claim 6 wherein said top surface of said top cover making an interface with the top surface of said plurality of lateral sides, said molded SD card further having a label attached to the top surface of said top cover to cover said interface for enhancing the esthetic quality of said molded SD card.

9. A secured digital (SD) card as recited in claim 8 wherein said notch formed on the outer wall of one of said plurality of lateral sides in a molding process to insertably position said male guide therein.

10. A secured digital (SD) card as recited in claim 9 wherein said top cover being positioned on top of said printed circuit board (PCB) assembly inside said bottom plastic piece for cross linking said bottom plastic piece and said top cover in a molding process, said top cover and said bottom plastic piece molded at a substantially high glass transition temperature for cross linking said bottom plastic piece and the molding plastic material.

11. A secured digital (SD) card as recited in claim 1 wherein said printed circuit board (PCB) assembly including a substrate onto which a plurality of devices are mounted using surface mount technology (SMT), said plurality of devices including a memory unit and a controller, said plurality of devices further including discrete components, said memory unit storing information in said SD card.

12. A secured digital (SD) card as recited in claim 11 wherein said male guide being a bar, said female switch sliding over said male guide to acquire two positions the first of which for allowing information to be written onto said memory unit of said SD card and the second of said positions for preventing information to be written onto said memory unit.

13. A secured digital (SD) card as recited in claim 1 wherein the top surface of said top cover making an interface with the top surface of said plurality of lateral sides, said SD card further having a label attached to the top surface of said top cover to cover said interface for enhancing the esthetic value of said SD card.

14. A secured digital (SD) card as recited in claim 1 wherein said printed circuit board (PCB) assembly being a chip on board (COB) memory module having a plurality of devices, said plurality of devices including a memory unit and a controller, said memory unit for storing information in said SD card.

* * * * *